US008030984B2

(12) United States Patent
Ayraud

(10) Patent No.: US 8,030,984 B2
(45) Date of Patent: Oct. 4, 2011

(54) CIRCUIT FOR CLOCK EXTRACTION FROM A BINARY DATA SEQUENCE

(75) Inventor: Michel Ayraud, Voreppe (FR)

(73) Assignee: E2V Semiconductors (FR)

( * ) Notice: Subject to any disclaimer, the term of this patent is extended or adjusted under 35 U.S.C. 154(b) by 142 days.

(21) Appl. No.: 12/514,617

(22) PCT Filed: Nov. 13, 2007

(86) PCT No.: PCT/EP2007/062255
§ 371 (c)(1),
(2), (4) Date: May 28, 2009

(87) PCT Pub. No.: WO2008/061914
PCT Pub. Date: May 29, 2008

(65) Prior Publication Data
US 2010/0013520 A1    Jan. 21, 2010

(30) Foreign Application Priority Data
Nov. 24, 2006    (FR) ...................................... 06 10310

(51) Int. Cl.
*G06F 1/04* (2006.01)
*H03K 3/00* (2006.01)
(52) U.S. Cl. ........ 327/291; 327/156; 327/158; 327/172; 331/16
(58) Field of Classification Search .................. 327/156, 327/158, 172, 291
See application file for complete search history.

(56) References Cited

U.S. PATENT DOCUMENTS

| 5,124,669 | A | 6/1992 | Palmer et al. |
| 5,760,653 | A | 6/1998 | Soda |
| 6,342,817 | B1 * | 1/2002 | Crofts et al. ................. 331/1 R |
| 6,542,041 | B2 | 4/2003 | Choi |
| 6,704,382 | B1 | 3/2004 | Metzler et al. |
| 2001/0043086 | A1 | 11/2001 | Idei et al. |

FOREIGN PATENT DOCUMENTS

JP    63094731    6/1988

OTHER PUBLICATIONS

Bedu, J. Y., "Les PLL'S Numeriques", Electronique Radio Plans, SPE, Paris, FR, No. 519, Feb. 1991, pp. 9-12, XP00022414, ISSN: 1144-5742.

* cited by examiner

*Primary Examiner* — Lincoln Donovan
*Assistant Examiner* — John Poos
(74) *Attorney, Agent, or Firm* — Lowe Hauptman Ham & Berner, LLP

(57) ABSTRACT

The invention relates to an electronic circuit making it possible to extract a clock signal from an incident binary data sequence arriving at a constant rate. The electronic circuit comprises an oscillator (VCO) with voltage-controlled frequency providing a sinusoidal signal, a circuit (R, Cp, RD, I1, I2) for extracting the transition edges of the binary sequence producing a brief pulse at each transition, a sampler (MLT) for tapping off the level of the sinusoidal voltage at the instant of the brief pulse, and an integrator (AOP, R1, C1) for integrating this level in tandem with the successive pulses, the output of the integrator being applied as control voltage to the oscillator with controlled frequency, the output of the oscillator being the desired clock frequency with a slaved phase passing through zero substantially in the middle of the interval between two binary data transitions. Such a circuit is useful in applications for transmitting digital data of serial type, in which the data are received without at the same time receiving a clock signal.

19 Claims, 3 Drawing Sheets

CIRCUIT FOR CLOCK EXTRACTION FROM A BINARY DATA SEQUENCE

CROSS-REFERENCE TO RELATED APPLICATIONS

The present Application is based on International Application No. PCT/EP2007/062255, filed on Nov. 13, 2007, which in turn corresponds to French Application No. 0610310, filed on Nov. 24, 2006, and priority is hereby claimed under 35 USC §119 based on these applications. Each of these applications are hereby incorporated by reference in their entirety into the present application.

FIELD OF THE INVENTION

The invention relates to an electronic circuit making it possible to extract a clock signal from an incident binary data sequence arriving at a constant rate corresponding to the rate at which these data were emitted.

Such a circuit is useful in applications for transmitting digital data of serial type, in which the data are received without at the same time receiving a clock signal which would make it possible to ascertain the exact tempo at which the data were emitted. This is typically the case for wire-based transmission according to the USB standards. This is also the case for infrared transmissions between a computer peripheral and a computer or more generally between two apparatuses.

BACKGROUND OF THE INVENTION

In order to process the incident data, it is indispensable to reconstitute the emission tempo, and it is the role of the extraction circuit to produce a clock signal whose frequency is identical to the emission tempo and which moreover has a phase which is correctly defined with respect to the transitions of the binary data received. The question of the phase is particularly important since it would serve no purpose to reconstitute a clock signal having the desired exact frequency, that of emission, but whose transitions coincided with the transitions of the data or were too close to the latter: it would not be possible to sample the data with such a clock. In practice, it is sought to reconstitute a clock signal having a rising edge set substantially in the medium of the interval between the theoretical instants at which the binary data transitions may occur.

In what follows, it will be considered that the frequency that is to be reconstituted is the frequency at which the data were emitted, so as to simplify the explanations; however, the invention applies generally to the reconstitution of a clock frequency present in the data received, independently of the frequency emitted, in the cases where there is a shift (due to a Doppler effect notably) between the frequency received and the frequency emitted.

Circuits for reconstituting clock signals from incident binary data have already been proposed in the prior art. Examples thereof will be found in the following publications:

US 2001/0043086; this document makes a digital measurement of a phase error and generates pulses of variable width proportional to the phase error; this principle of digital measurement prevents operation at very high frequency;

U.S. Pat. No. 5,124,669; this document also describes a digital measurement

U.S. Pat. No. 5,760,653; uses a clock with triangular waveform, difficult to implement at very high frequency; it also uses a sample-and-hold unit to control an oscillator with voltage-controlled frequency, so that this oscillator sees a control voltage vary steeply at each sampling;

JP 63094731; this document describes a system in which the incident edges of the incoming data are transformed into Gaussian forms, thereby tending to lose the information about the precise instant of the binary transitions;

U.S. Pat. No. 6,542,041; this document operates with digital phase detectors providing variable pulse widths; it does not lend itself to a high input data rate.

SUMMARY OF THE INVENTION

The aim of the invention is to propose a simple circuit that is easy to implement and has improved performance, in order to reconstitute a clock signal from serial binary data.

For this purpose the invention proposes an electronic circuit for clock signal extraction from an incident binary data sequence, characterized in that the circuit comprises an oscillator with voltage-controlled frequency providing a sinusoidal signal, a circuit for extracting the transition edges of the binary sequence producing a brief pulse at each transition, a sampler for tapping off the level of the sinusoidal voltage at the instant of the brief pulse, and an integrator for integrating this level in tandem with the successive pulses, the output of the integrator being applied as control voltage to the oscillator with controlled frequency, the output of the oscillator being the desired clock frequency with a slaved phase passing through zero substantially in the middle of the interval between two binary data transitions.

The circuit for extracting the transition edges comprises in principle a differentiator circuit followed by a rectifier and by a shaping circuit.

The sampler comprises an analog multiplication circuit for multiplying the sinusoidal voltage by the brief pulse; this multiplier can be a simple switch which applies the sinusoidal voltage to the integrator at the instant of the brief pulse, or else a transconductance amplifier whose power supply is activated by the brief pulse and deactivated outside of this pulse.

The integrator can comprise a capacitor charged by a current proportional to the value of the sinusoidal voltage at the instant of the brief pulse.

Preferably, to facilitate the latching of the slaving loop thus constituted at the start of the data application, or in the case of loss of slaving, a hysteresis-type threshold-based comparator receiving the control voltage of the oscillator with controlled frequency is provided, this comparator forcing the output of the integrator to a certain value in the case of overstepping of the threshold. If the threshold is a high threshold, it is possible to force the output of the integrator to zero. It is however more advantageous to have a double threshold (high threshold, low threshold) and to force the output of the integrator to a nominal value in the case of overshoot of the high threshold or in the case of undershoot of the low threshold. This nominal value is chosen in the variety of the control voltage that has to be applied to the oscillator to obtain the theoretical frequency at which the binary data is expected to be received.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIG. 4 represents a variant embodiment of the circuit according to the invention;

DETAILED DESCRIPTION OF THE INVENTION

The assumption is made that the theoretical duration of a bit is $To=1/Fo$, that is to say the transitions between successive bits are separated by the interval To. It will be understood that the problem of clock reconstitution arises because the transitions are invisible when successive bits of the same value are emitted. The first line of the timechart of FIG. 2 represents an exemplary binary sequence received on the input A of the clock extraction circuit of FIG. 1; the 1s are represented by a high level, the 0s by a low level.

From the input A, the binary data are applied to a differentiation circuit, represented by its simplest configuration, namely a series assembly of a capacitor Cp and a resistor R, the capacitor being linked to the input A and the resistor to a ground M. The output B of this differentiation circuit is taken at the junction point of the resistor and capacitor. This output B provides positive pulses on the rising edges of the binary transitions and negative pulses on the falling edges (second line of the timechart).

The output B is linked to the input of a full-wave rectifier RD whose function is to transform the positive and negative pulses into positive pulses on its output C (third line of the timechart).

The output C of the rectifier can be applied to a shaping circuit which standardizes the amplitude of the pulses. This shaping circuit is here composed of two inverters I1 and I2 in cascade. The output D of the second inverter produces rectangular brief pulses of practically constant amplitude and duration at each binary data transition edge, whether rising or falling (fourth line of the timechart of FIG. 2 and first line of the timechart of FIG. 3, the latter timechart being expanded along the time and amplitude scale).

The assembly of elements R, C, RD, I1, I2 therefore constitutes a circuit for extracting the transition edges of the incident binary data. It will be understood that this extraction circuit can be embodied in various ways, the expected result being a brief pulse at each rising transition and at each falling transition.

Figure 1:
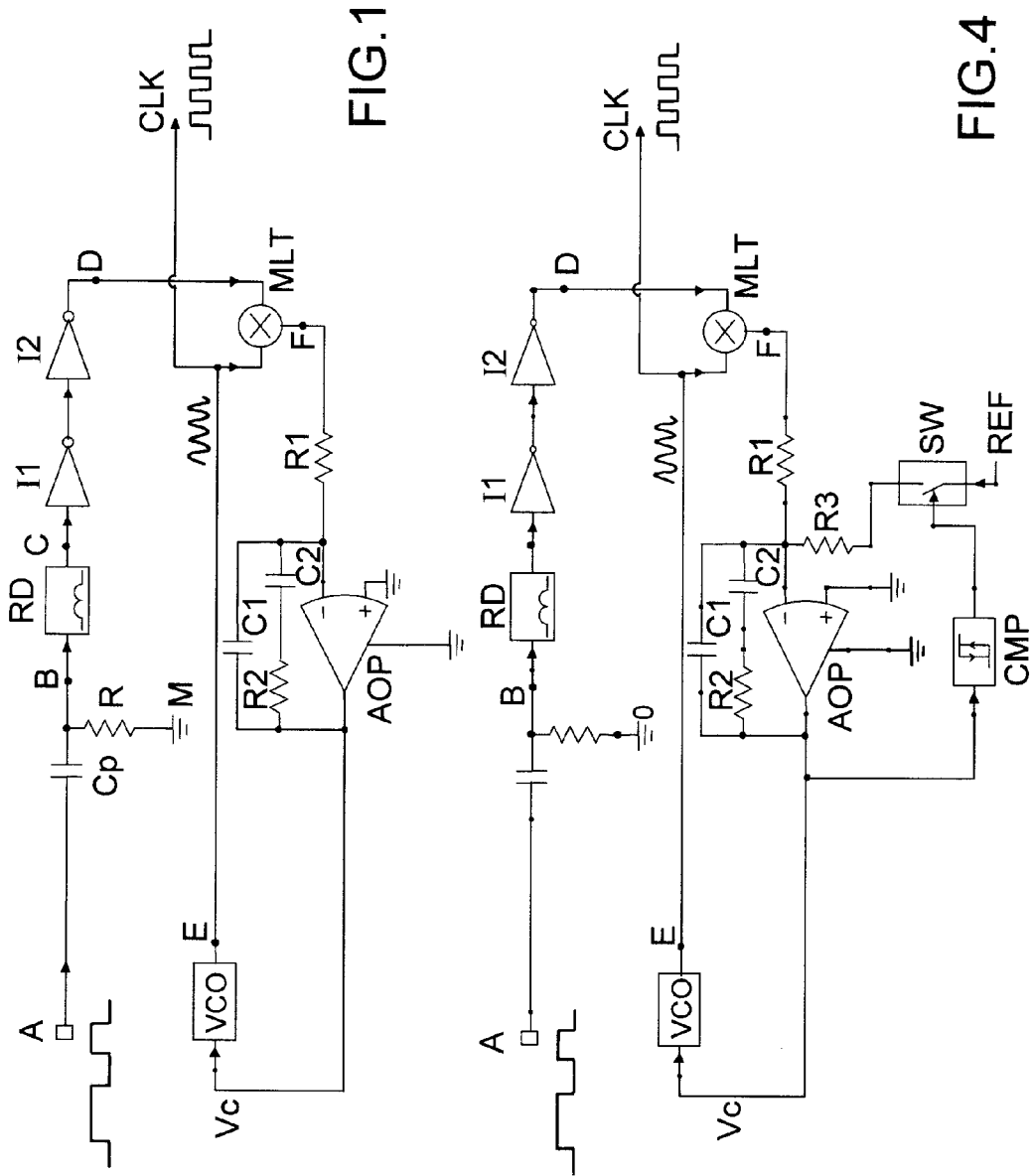
FIG. 1 represents a diagram of the circuit for extracting data according to the invention.
Figure 2:
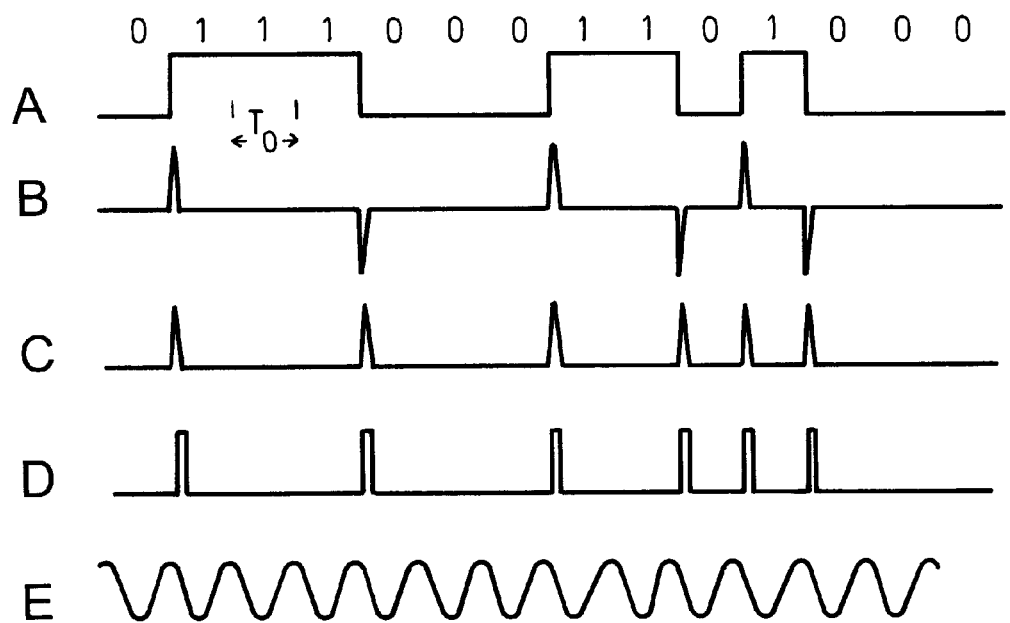
FIG. 2 represents a timechart of signals illustrating the operation of a part of the circuit of FIG. 1.

The clock extraction circuit of FIG. 1 thereafter comprises an oscillator VCO with frequency controlled by a voltage (or by a current, but in this example, it is considered to be controlled by a voltage). The oscillator VCO provides on its output E a sinusoidal signal whose frequency depends on the amplitude of the control voltage Vc applied to its input (fifth line of the timechart of FIG. 2 and second line of the expanded timechart of FIG. 3).

This control voltage Vc is provided by a slaving circuit which maintains it at a mean value for which the frequency of the oscillator is equal to the frequency Fo of the incoming binary data ($Fo=1/To$). A period of the oscillator is therefore equal to the duration of a bit of the sequence if the loop is correctly slaved.

To ensure slaving, the level of the sinusoidal signal at the output of the oscillator at the moment of the brief pulse is measured and this level is applied to a voltage integration circuit for the duration of the brief pulse. The measurement of sinusoidal voltage level is made by a sampler. In its simplest version, the sampler is a simple switch controlled by the brief pulse, which transmits the voltage level that it receives at the moment of the pulse. In a more sophisticated version, the sampler can be considered to be an analog multiplier, which "multiplies" the voltage level that it receives by a determined gain during the brief pulse and by zero outside of the pulse, and which produces a voltage or a current proportional to the level received.

FIG. 1 represents a multiplier MLT which receives the signal on the node E which constitutes its first input, and the brief pulse on the node D which constitutes its second input.

Figure 3:
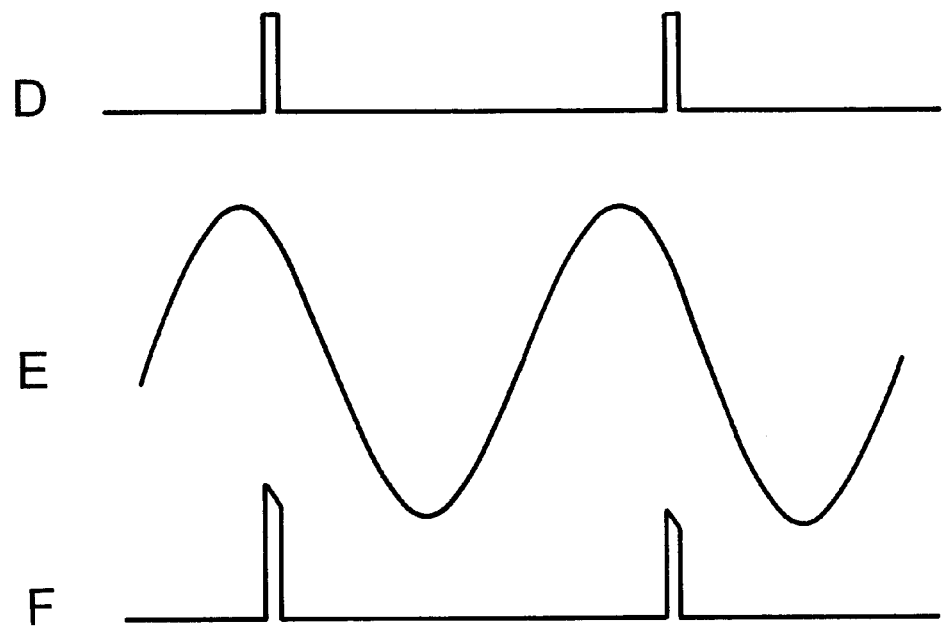
FIG. 3 represents a timechart of another part with an expanded time and amplitude scale.

The result on the output F of the multiplication circuit MLT is a voltage of a variable level, depending on the moment of the pulse with respect to the zero phase of the sinusoidal signal, for the duration of the brief pulse (third line of the timechart of FIG. 3). Two successive pulses separated by a period of the sinusoid have been represented on the third line of the timechart; it must be understood that the pulses may be separated by several periods when the binary input sequence comprises several successive 0s or several successive 1s.

The integration circuit integrates the voltage (or the current) on the output F and its output voltage Vc increases all the more at each pulse when the voltage level of the oscillator at the moment of this pulse is positive and higher; it decreases all the more when the level is negative and higher. It remains constant if the voltage level at the moment of the brief pulse is near zero. The voltage Vc will stabilize around a control value Vco corresponding to a frequency produced equal to the frequency Fo and a phase such that the brief pulse settles on a near-zero phase of the sinusoidal voltage; specifically, the multiplication circuit then provides a zero or almost zero voltage during the brief pulse and neither adds to nor deducts from the voltage of the integrator.

This principle operates independently of the frequency of appearance of the brief pulses representing the binary transitions of the input data. No pulse is produced during a certain time if a succession of 0s or of 1s occurs in the input data, but the integrator then retains its output voltage until the next pulses. The only problem is that the integration time constant lengthens if the binary data are not alternated sufficiently often.

The integration time constant must be slow so that the system is not sensitive to the phase noise of the incoming binary data (jitter of the incoming data) but not too slow so that the latching of the loop is not too long at the outset or after a dropout (break in the infrared link for example in a communication by serial infrared port).

The output of the clock extraction circuit may be directly the output of the VCO oscillator if a sinusoidal clock is needed; if a square clock signal CLK is needed, the output of the oscillator is applied to a shaping circuit MF (a simple comparator with large gain may be suitable) which converts the sinusoidal waveform into a square form without changing the phase thereof.

The integrator can be embodied on the basis of a simple operational amplifier AOP having a resistive input (resistor R1) and a capacitive looping between the input and the output. In the example represented, the capacitive looping comprises a capacitor C1 in parallel with a series assembly of a resistor R2 and a capacitor C2 enabling a phase-advance integration to be achieved in a conventional manner. The capacitor C1 serves for integration at high frequency, the capacitor C2 serves rather more to allow through the low frequencies; at the mean frequencies, potential sources of instability, the integrator acts rather more as a non-integrating amplifier.

FIG. 4 represents a modification of the clock extraction circuit making it possible to facilitate the resettling of the slaving in the case of loss of synchronization or at the start of the reception of a binary sequence.

This refinement comprises a threshold-based circuit resetting the output voltage of the integrator or the control voltage of the oscillator to a predetermined level if this voltage departs from a normal range of values having regard to the expected frequency of the binary data.

In other words, the oscillator ought to oscillate at the frequency Fo corresponding to a nominal voltage Vco, and the voltage variations around Vco ought not normally exceed a certain range. If one departs from this range, it is probably because the slaving has dropped out. In this case, rather than letting the loop slowly regain a slaved state which might be poor (slaving to a double frequency for example), the voltage Vc is forced to a predetermined value which helps to regain a proper slaved position more rapidly.

In a simple example, one merely looks with the aid of a threshold-based (and hysteresis-type) comparator CMP to see whether the voltage Vc exceeds a high threshold Vsh, and this voltage is then forced to zero, or to a low value below the normal range of variation of Vc. From this low value it can do nothing other than rise progressively towards a stable value slaved in the right range of values when the incident binary data sequence becomes stabilized again. The output voltage can be forced to a low value by applying to the input of the operational amplifier, through a resistor R3, a fixed voltage REF which discharges the looping capacitors C1 and C2. The comparator CMP controls a switch SW to perform this action if the threshold is overstepped.

In a more sophisticated and preferable solution, the voltage Vc is compared with a high threshold Vsh and with a low threshold Vsbn with the aid of a hysteresis-type double comparator. If the voltage Vc overshoots Vsh or undershoots Vsb, the output is then forced to a constant value which is for example the theoretical voltage Vco which produces the frequency Fo. The return of the slaving in the case of data loss is thus at one and the same time faster and more certain.

In an example, if the circuit assembly is supplied between 0 volts and +5 volts, the nominal voltage Vco giving the frequency Fo can be 3 volts, and the admissible range of variation Vsb, Vsh can be from 1.2 volts to 4 volts.

Figure 5:
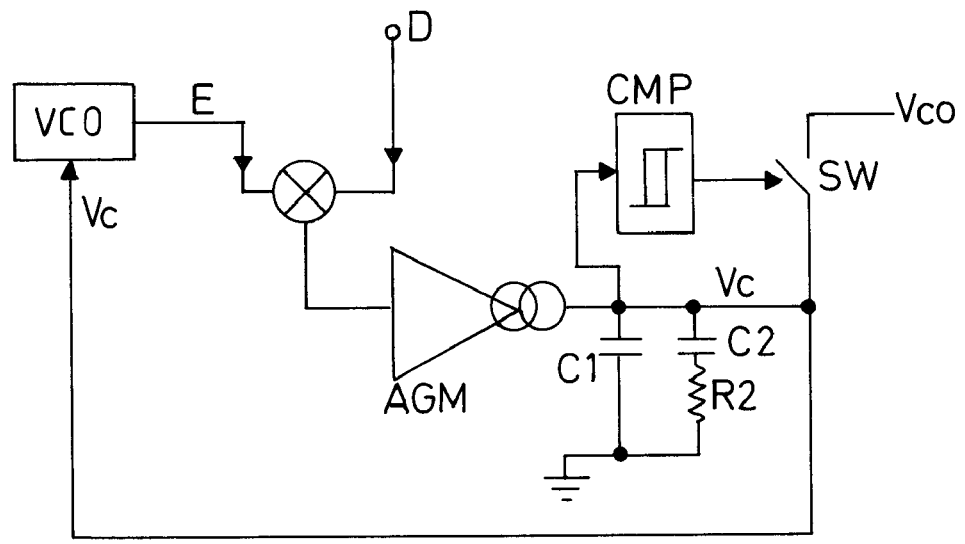
FIG. 5 represents an embodiment in which the sampler comprises a transconductance amplifier.

To force the output of the integrator to an intermediate value such as Vco or a close value, it may be preferable to provide for the integration circuit to be a current integration circuit rather than a voltage integration circuit. This is represented in FIG. 5. The sinusoidal output voltage of the oscillator VCO is applied to the analog multiplier MLT (which, it is recalled, may be a simple switch closed during the brief pulse representing a binary data transition). The output F of the multiplier is applied to a transconductance amplifier AGM which converts the voltage that it receives into current proportional to this voltage. The output current of the amplifier AGM, which lasts as long as the brief pulse, is applied to an integrator which comprises a simple capacitor C1 (or an assembly C1, R2, C2 similar to that of FIG. 4 if phase-advance integration is desired).

It is the voltage across the terminals of the capacitor C1 which is the voltage Vc applied as control signal to the oscillator VCO.

In this case, it is easy, in the case that one departs from the range Vsb, Vsh, to close through a switch SW, under the control of the double-threshold and hysteresis-type comparator CMP, a breaker linking the capacitor C1 to a voltage reference of value Vco (for example). The capacitor charges to this value Vco, in the admissible range, which reopens the switch SW and allows the slaving to re-establish itself starting from a reliable base.

In the foregoing, it was considered that the sampler and the integrator were two very separate functions. It will be noted that in practical electronic integrated circuit embodiments, it may be easier to mix these functions so as to culminate in the same global function.

Figure 6:
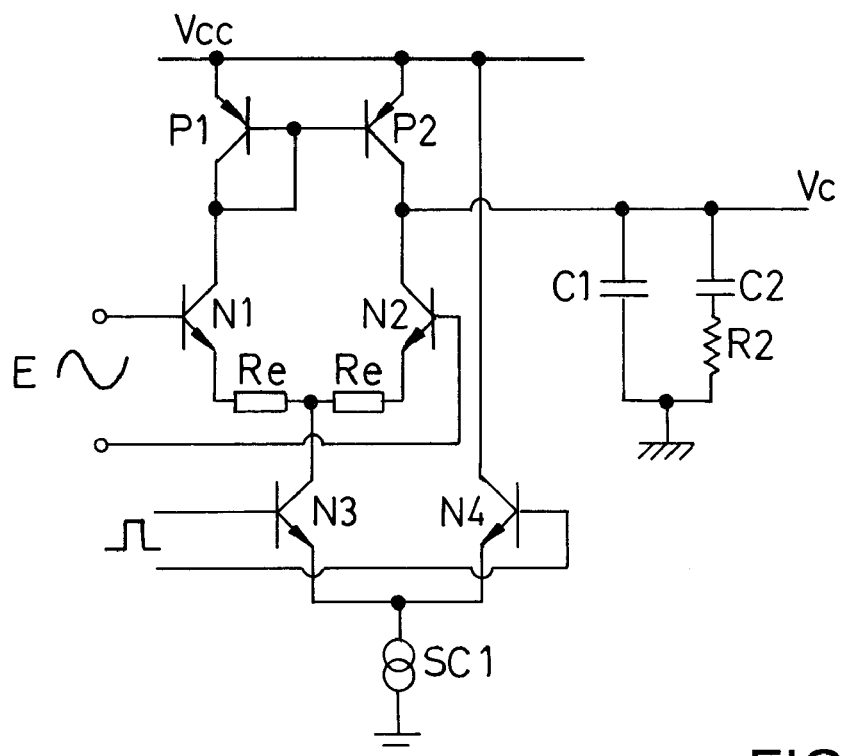
FIG. 6 represents an embodiment of the sampler with a transconductance amplifier, the current supply to which is controlled by the brief pulse.

Thus, FIG. 6 represents an embodiment of a sampler which receives at one and the same time the sinusoidal voltage of the oscillator VCO and the brief pulse representing a data transition, and which produces an output current proportional to the sinusoidal voltage during the brief pulse. This output current charges a capacitor C1 (or an assembly C1, C2, R2) across the terminals of which is tapped off the voltage Vc which controls the oscillator. The capacitor acts as an integrator of the current received.

The sampler (or analog multiplier) comprises in this example a differential pair of two NPN bipolar transistors N1 and N2 whose currents are linearized by identical emitter resistors Re; the collectors are charged the one by a PNP transistor P1 mounted as a diode, the other by a PNP transistor P2 having its base and its emitter linked to the base and to the emitter of the transistor P1. The differential pair N1, N2 is supplied with outgoing current by a current source SC1 that can be interrupted by a transistor N3 controlled by the brief pulse present at the node D of the circuit of FIG. 1 or 4. A transistor N4 is linked between the current source and the supply voltage Vcc of the differential pair so as to absorb the current of the source SC1 when the transistor N3 is off. The transistor N4 is on when the transistor N3 is off and vice versa, the brief pulse at the node D being preferably applied directly between the bases of the transistors N3 and N4.

Outside of the brief pulse, the differential pair is not supplied with current and does not produce any differential output current heading towards the integration capacitor. During the brief pulse, an unbalance current proportional to the output voltage of the oscillator is directed towards the integration capacitor connected between the collector of the transistor N2 and the ground.

In this embodiment, it has been considered that the sinusoidal voltage at the node E is a differential voltage and not a simple voltage with respect to ground as was represented in FIGS. 1 and 4; the same holds for the brief pulse at the node D. It is in general very simple and advantageous to work with differential voltages and currents in integrated circuits.

This circuit of FIG. 6 carries out the analog multiplication function for multiplying a voltage (between the bases of N1 and N2) by the brief pulse, at the same time as an amplification with transconductance function; the output capacitor C1 affords the integration function. The transconductance amplifier consisting of the pair of differential branches (N1, N2, P1, P2) has its current supply (SC1) activated by the brief pulse. This current supply is diverted by the transistor N4 outside of the brief pulse.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An electronic circuit for extracting clock signal from an incident sequence of binary data, comprising:
    an input terminal configured to receive the incident sequence;
    an oscillator configured to provide a sinusoidal signal having a frequency controlled by a control voltage;
    a circuit connected to the input terminal and configured to extract transition edges of the incident sequence and configured to provide successive brief pulses at the transition edges;
    a sampler configured to receive the brief pulses and the sinusoidal signal for tapping off level of the sinusoidal signal at instants of the brief pulses; and
    an integrator connected to an output of the sampler for integrating the level in tandem with the successive brief pulses, the integrator having an output of the control signal connected to an input of the oscillator,
    wherein the oscillator is configured to provide the sinusoidal signal as the clock signal extracted from the incident sequence of the binary data with a slaved phase relative to the transition edges of the binary data.

2. The clock extraction circuit as claimed in claim 1, wherein the circuit for extracting the transition edges comprises a differentiator circuit followed by a rectifier and by a shaping circuit.

3. The clock extraction circuit as claimed in claim 1, wherein the sampler comprises an analog multiplication circuit for multiplying the sinusoidal signal by the brief pulses.

4. The clock extraction circuit as claimed in claim 3, wherein the analog multiplication circuit comprises a transconductance amplifier, the supplying of which with current is activated by the brief pulses.

5. The clock extraction circuit as claimed in claim 1, wherein the integrator comprises a capacitor charged by a current proportional to the level of the sinusoidal signal at the instants of the brief pulses.

6. The clock extraction circuit as claimed in claim 1, further comprising a hysteresis-type threshold-based comparator receiving the control voltage of the oscillator, the comparator forcing the output of the integrator to a zero value in the case of overstepping of a threshold.

7. The clock extraction circuit as claimed in claim 1, further comprising a double-threshold hysteresis-type threshold-based comparator having both a high threshold and a low threshold, the comparator forcing the output of the integrator to a nominal value in the case of overshoot of the high threshold or in the case of undershoot of the low threshold.

8. The clock extraction circuit as claimed in claim 2, wherein the sampler comprises an analog multiplication circuit for multiplying the sinusoidal signal by the brief pulses.

9. The clock extraction circuit as claimed in claim 3, wherein the analog multiplication circuit comprises a transconductance amplifier, the supplying of which with current is activated by the brief pulses.

10. The clock extraction circuit as claimed in claim 2, wherein the integrator comprises a capacitor charged by a current proportional to the level of the sinusoidal signal at the instants of the brief pulses.

11. The clock extraction circuit as claimed in claim 2, further comprising a hysteresis-type threshold-based comparator receiving the control voltage of the oscillator, the comparator forcing the output of the integrator to a zero value in the case of overstepping of a threshold.

12. The clock extraction circuit as claimed in claim 2, further comprising a double-threshold hysteresis-type threshold-based comparator, having both a high threshold and a low threshold, the comparator forcing the output of the integrator to a nominal value in the case of overshoot of the high threshold or in the case of undershoot of the low threshold.

13. The clock extraction circuit as claimed in claim 3, wherein the integrator comprises a capacitor charged by a current proportional to the level of the sinusoidal signal at the instants of the brief pulses.

14. The clock extraction circuit as claimed in claim 3, further comprising a hysteresis-type threshold-based comparator receiving the control voltage of the oscillator, the comparator forcing the output of the integrator to a zero value in the case of overstepping of a threshold.

15. The clock extraction circuit as claimed in claim 3, further comprising a double-threshold hysteresis-type threshold-based comparator, having both a high threshold and a low threshold, the comparator forcing the output of the integrator to a nominal value in the case of overshoot of the high threshold or in the case of undershoot of the low threshold.

16. The clock extraction circuit as claimed in claim 4, further comprising a hysteresis-type threshold-based comparator receiving the control voltage of the oscillator, the comparator forcing the output of the integrator to a zero value in the case of overstepping of a threshold.

17. The clock extraction circuit as claimed in claim 4, further comprising a double-threshold hysteresis-type threshold-based comparator, having both a high threshold and a low threshold, the comparator forcing the output of the integrator to a nominal value in the case of overshoot of the high threshold or in the case of undershoot of the low threshold.

18. The clock extraction circuit as claimed in claim 5, further comprising a hysteresis-type threshold-based comparator receiving the control voltage of the oscillator, the comparator forcing the output of the integrator to a zero value in the case of overstepping of a threshold.

19. The clock extraction circuit as claimed in claim 5, further comprising a double-threshold hysteresis-type threshold-based comparator, having both a high threshold and a low threshold, this comparator forcing the output of the integrator to a nominal value in the case of overshoot of the high threshold or in the case of undershoot of the low threshold.

* * * * *